United States Patent
Son et al.

(10) Patent No.: US 7,978,521 B2
(45) Date of Patent: Jul. 12, 2011

(54) MEMORY DEVICE AND METHOD OF PROGRAMMING THEREOF

(75) Inventors: Hong Rak Son, Hwaseong-si (KR); Jae Hong Kim, Seoul (KR); Jun Jin Kong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/453,594

(22) Filed: May 15, 2009

(65) Prior Publication Data

US 2010/0008146 A1    Jan. 14, 2010

(30) Foreign Application Priority Data

Jul. 10, 2008  (KR) .................. 10-2008-0067030

(51) Int. Cl.
*G11C 16/04*    (2006.01)
(52) U.S. Cl. .......................... 365/185.19; 365/185.18
(58) Field of Classification Search ............. 365/185.19, 365/185.18
See application file for complete search history.

(56) References Cited

U.S. PATENT DOCUMENTS

| | | | |
|---|---|---|---|
| 6,721,204 | B1 | 4/2004 | Yeh et al. |
| 6,928,001 | B2 | 8/2005 | Avni et al. |
| 7,355,897 | B2 | 4/2008 | Hsu et al. |
| 2007/0115719 | A1 | 5/2007 | Wu |
| 2007/0236994 | A1 | 10/2007 | Hsu et al. |
| 2008/0031053 | A1* | 2/2008 | Wu .......................... 365/185.29 |

FOREIGN PATENT DOCUMENTS

| | | |
|---|---|---|
| JP | 2005-317191 | 11/2005 |
| KR | 10-2001-0105143 | 11/2001 |

* cited by examiner

*Primary Examiner* — Huan Hoang
(74) *Attorney, Agent, or Firm* — Harness, Dickey & Pierce

(57) ABSTRACT

The method of programming data in a memory device includes applying a plurality of pulses to a plurality of memory cells, at least one of the plurality of pulses being a positive pulse having a positive voltage and at least one of the plurality of pulses being a negative pulse having a negative voltage, and a temporal interval existing between subsequent pulses of the plurality of pulses, and controlling at least one of a width of at least one of the temporal intervals and a magnitude of at least one of the plurality of pulses.

18 Claims, 7 Drawing Sheets

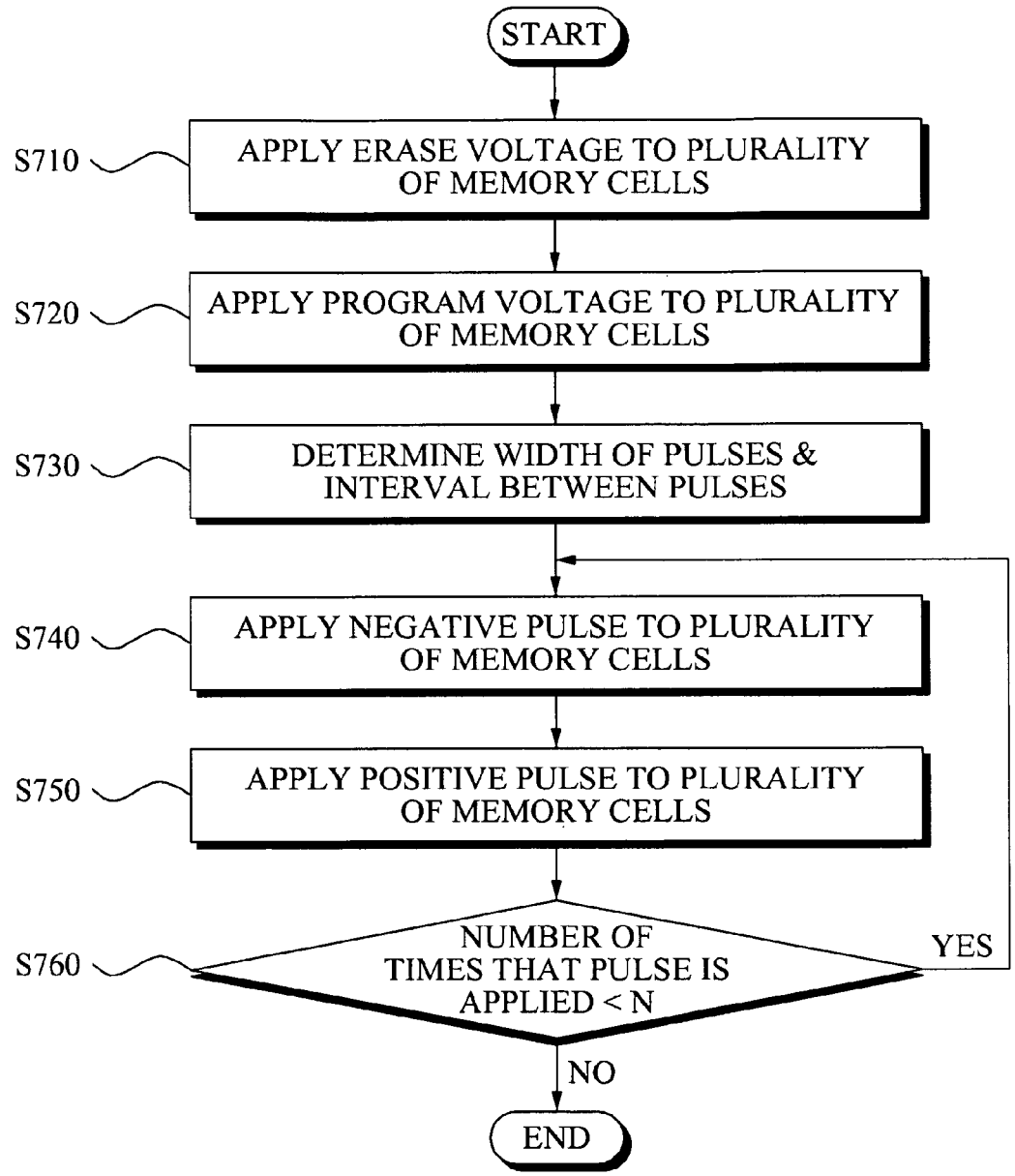

MEMORY DEVICE AND METHOD OF PROGRAMMING THEREOF

PRIORITY STATEMENT

This application claims priority under 35 U.S.C. §119 to Korean Patent Application No. 10-2008-0067030, filed on Jul. 10, 2008, in the Korean Intellectual Property Office (KIPO), the entire contents of which are incorporated herein by reference.

BACKGROUND

1. Field

Example embodiments relate to apparatuses and methods that may program data in a memory device. For example, example embodiments relate to apparatuses and methods that may change a threshold voltage of a memory cell to thereby program data in a memory device.

2. Description of the Related Art

A non-volatile semiconductor memory is widely used as one of various types of storage devices that can continuously store previously stored information even when power is shut off. An example of a non-volatile memory may be a flash memory. In comparison to a conventional Hard Disk Drive (HDD), a size of the flash memory may be relatively small. The flash memory may also consume less power and have a higher read speed compared to the HDD. Currently, a solid state disk (SSD), which uses a relatively large amount of flash memory, is being offered as a replacement for the HDD.

Examples of the flash memory may include a NAND flash memory, a NOR flash memory, and the like. A NAND scheme and a NOR scheme may be distinguished based on a configuration of a cell array and an operational scheme of the cell array.

The flash memory may include a plurality of memory cells. A single memory cell may store at least one data bit. The single memory cell may include a control gate and a floating gate. An insulator may be inserted between the control gate and the floating gate. The insulator may also be inserted between the floating gate and a substrate.

A process of storing data in a memory cell of the flash memory may be referred to as a "program". A process of erasing the program or the data may be performed by a hot carrier effect or a Fowler-Nordheim (F-N) tunneling mechanism.

SUMMARY

Example embodiments may provide apparatuses and/or methods that may reduce a distribution width of a threshold voltage of memory cells.

Example embodiments may provide apparatuses and/or methods that may reduce a time to stabilize a threshold voltage of memory cells.

Example embodiments may provide apparatuses and/or methods that may improve a mobility in a charge trap layer or a charge trap site of memory cells of a Charge Trap Flash (CTF).

Example embodiments may provide apparatuses and/or methods that may control a frequency domain characteristic of programming pulses of a memory device.

According to an example embodiment, a method of programming data in a memory device includes applying a plurality of pulses to a plurality of memory cells, at least one of the plurality of pulses being a positive pulse having a positive voltage and at least one of the plurality of pulses being a negative pulse having a negative voltage, and a temporal interval existing between subsequent pulses of the plurality of pulses, and controlling at least one of a width of at least one of the temporal intervals and a magnitude of at least one of the plurality of pulses.

According to an example embodiment, a method of programming memory data includes applying a program voltage to at least one of a plurality of memory cells to charge charges in at least one of the plurality of memory cells, applying at least one negative pulse to at least one of the plurality of memory cells to move the charged charges, and applying at least one positive pulse to the plurality of memory cells to move the charged charges.

According to an example embodiment, a memory device includes a memory cell array including a plurality of memory cells, a programming unit configured to apply a plurality of pulses to the plurality of memory cells, at least one of the plurality of pulses being a positive pulse having a positive voltage and at least one of the plurality of pulses being a negative pulse having a negative voltage, and a temporal interval existing between subsequent pulses of the plurality of pulses, and a control unit configured to control at least one of a width of at least one of the temporal intervals and a magnitude of at least one of the plurality of pulses.

BRIEF DESCRIPTION OF THE DRAWINGS

The above and other features and advantages will become more apparent by describing in detail example embodiments thereof with reference to the attached drawings in which:

FIG. 7 is a flowchart illustrating a method of programming memory data according to an example embodiment.

DETAILED DESCRIPTION OF EXAMPLE EMBODIMENTS

Figure 1:
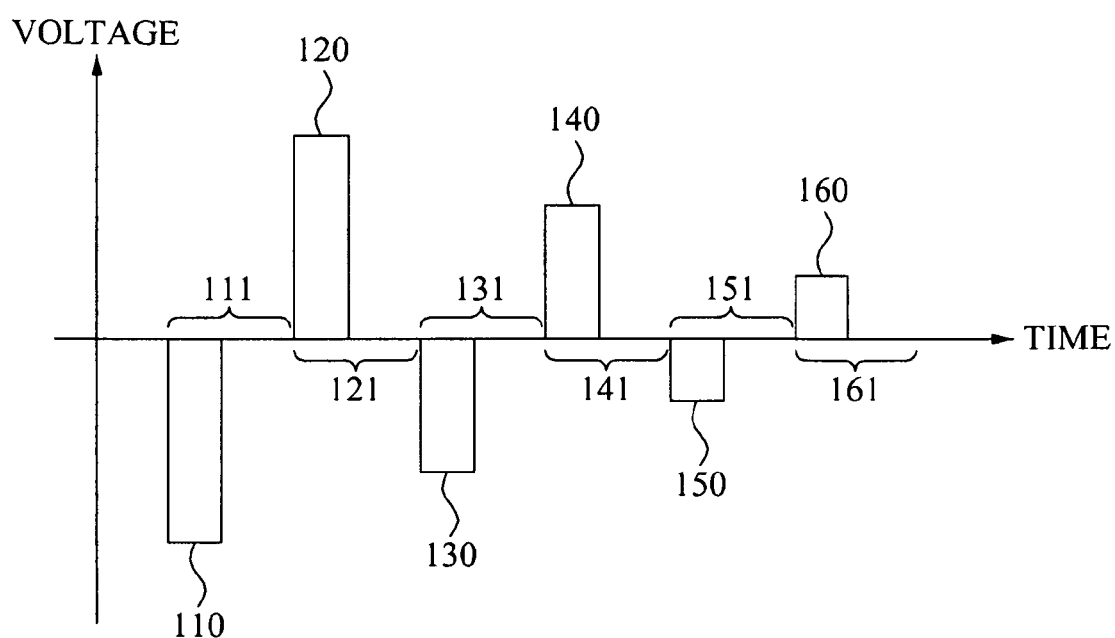
FIG. 1 is a timing diagram illustrating a voltage applied with respect to time by a method of programming memory data according to an example embodiment.

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present.

In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

The figures are intended to depict example embodiments and should not be interpreted to limit the intended scope of the claims. The accompanying figures are not to be considered as drawn to scale unless explicitly noted. In this specification, the term "and/or" picks out each individual item as well as all combinations of them.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

When it is determined that a detailed description related to a related known function or configuration may make the purpose of example embodiments unnecessarily ambiguous, the detailed description thereof will be omitted. Also, terms used herein are defined to appropriately describe example embodiments and thus may be changed depending on a user, the intent of an operator, or a custom. Accordingly, the terms must be defined based on the following overall description within this specification.

Reference will now be made to example embodiments, which are illustrated in the accompanying drawings, wherein like reference numerals may refer to like components throughout.

Example embodiments may be applicable to memory devices that change a threshold voltage of a memory cell to thereby store data, for example, a flash memory, electrically erasable programmable read only memory (EEPROM), a phase shift random access memory (PRAM), a magnetic random access memory (MRAM), and the like.

A memory cell of a non-volatile memory device may be classified into a single-level cell (SLC) or a multi-level cell (MLC) depending on density of data stored in the memory cell.

An SLC memory device may store one bit of data in a single memory cell. The SLC memory device may also be referred to as a single-bit cell (SBC) memory. A process of storing one bit of data in a single level cell of the SLC memory device may be referred to as a program process and may change a threshold voltage of the single level cell. For example, when data of logic value "1" is stored in a single level cell, the single level cell may have a threshold voltage of 1.0 V. When data of logic value "0" is stored in the single level cell, the single level cell may have a threshold voltage of 3.0 V.

Due to a minute electrical characteristic difference between single level cells, the threshold voltage formed in each of the single level cells with the same data programmed may have a distribution within a predetermined range. For example, when a voltage read from a memory cell is greater than 0.5 V and less than 1.5 V, it may be determined that data stored in the memory cell has a logic value of "1". When the voltage read from the memory cell is greater than 2.5 V and less than 3.5 V, it may be determined that the data stored in the memory cell has a logic value of "0". The data stored in the memory cell may be classified depending on the difference between memory cell currents/voltages during the reading operations.

An MLC memory device may program at least two bits of data in the single memory cell. The MLC memory device may be referred to as a multi-bit cell (MBC) memory device. Since it is possible to increase the density of data stored in the MLC memory device, the MLC memory device may more be readily configured as a large capacity of memory. However, as the number of bits stored in the single memory cell increases, reliability may deteriorate and a read-failure rate may increase. To program "m" bits in a single memory cell, any one of $2^m$ threshold voltages may be required to be formed in the memory cell. Due to the minute electrical characteristic difference between memory cells, threshold voltages of memory cells with the same data programmed may form a distribution within a range. A single threshold voltage distribution may correspond to each of $2^m$ data values that can be generated according to "m" bits.

However, since the voltage window of a memory is limited, the distance between $2^m$ distributions of threshold voltage between adjacent bits may decrease as "m" increases, which may cause overlapping of the distributions. If the distributions overlap with each other, the read failure rate may increase.

Example embodiments are applicable to a charge trap memory including a multi-bit cell. The memory cell of the charge trap memory includes a charge trap site that is positioned between a gate terminal and a channel. A threshold voltage of the memory cell may be determined based on a charge amount charged in the charge trap site.

Due to an electric force that acts on charges stored in the charge trap site of adjacent memory cells of the charge trap memory, the charges charged in the charge trap site may move in a direction parallel with the channel. Also, a location or amount of charges charged in the charge trap site may be affected. Charges charged (or stored) in the charge trap memory may decrease over time according to the above mechanism. Thus, as a charge trap memory device maintains data over increasingly longer periods of time, the read-failure rate may increase.

The memory cell may have a gate terminal that is formed of metal or poly-silicon and may also have a floating gate between the gate terminal and the channel. The floating gate may also be formed of metal or poly-silicon.

The memory cell of the charge trap memory device may have a charge trap site between the gate terminal and the channel. The charge trap site may be an insulating layer. The charge trap site may have a permittivity greater than a first insulating layer that is disposed between the gate terminal and the channel.

For example, the first insulating layer formed of silicon oxide may be provided between the gate terminal and the channel. The charge trap site may be an insulating layer formed of silicon nitride. A silicon oxide layer may be disposed between the gate terminal and the silicon nitride layer. The silicon oxide layer may also be disposed between the silicon nitride layer and the channel. When the charge trap site is the insulating layer, it may be referred to as a charge trap layer.

A method of storing data in a charge trap memory device according to example embodiments may charge charges in a charge trap layer or discharge the charges from the charge trap layer to thereby change a threshold voltage of a memory cell. The method of storing data as described above may be referred to as program. The charges charged in the charge trap layer may move within a charge trap layer by an electric field formed between the channel and the gate terminal of the memory cell.

A memory device and a method of programming memory data according to example embodiments may program data in a charge trap memory device and then repeatedly change a direction of an electric field formed between a channel and a gate terminal of a memory cell to thereby stabilize charges charged in a charge trap layer. The charges charged in the charge trap layer may be coupled with carriers having an opposite characteristic while moving along the direction of the electric field. The memory device and/or the memory data programming method according to example embodiments may adjust a function according to a time of the direction and the magnitude of the electric field that is formed in the memory cell and thereby improve a mobility of charges within the charge trap layer. When the mobility of charges in the charge trap layer increases, it is possible to decrease a time that is required to stabilize data programmed in the memory cell.

FIG. 1 is a timing diagram illustrating a voltage applied with respect to time by a method of programming memory data according to an example embodiment.

Referring to FIG. 1, a pulse 110 is applied to a gate terminal of a memory cell in a first time interval 111. When the pulse 110 is applied to the gate terminal of the memory cell and a negative voltage corresponding to the pulse 110 is sufficiently large, charges charged in a charge trap layer may be discharged into a channel direction according to a Fowlder-Nordheim (F-N) tunneling mechanism. This process may be referred to as erase. The magnitude of a voltage of the pulse 110 may be also referred to as an erase voltage.

An erase process or a program process may require a relatively longer period of time than a read process. Thus, the erase process or the program process with respect to a plurality of memory cells may be simultaneously performed to save time.

A set of simultaneously erased memory cells may be referred to as a block or an erase block. Also, a set of simultaneously programmed memory cells may be referred to as a page.

A single block may be programmed with a plurality of pages. Since the erase process requires a relatively longer period of time than the program process, the erase process may be performed for larger units of memory cells than the program process.

A pulse 120 is applied to the gate terminal of the memory cell in a second time interval 121. When the pulse 120 is applied to the gate terminal of the memory cell and a positive voltage corresponding to the pulse 120 is sufficiently large, charges may be charged in the charge trap layer from a channel according to the F-N tunneling mechanism. This process may be referred to as a program process. The voltage magnitude of the pulse 120 may be also referred to as a program voltage.

Charges may be charged in the charge trap layer in the second time interval 121 and the threshold voltage of the memory cell may be changed. However, even after the second time interval 121, the threshold voltage of the memory cell may change according to a movement of the charges in the charge trap layer. Accordingly, the memory data programming method according to example embodiments may stabilize the charges stored in the charge trap layer using the following process.

Although a program process by the pulse 120 in the second time interval 121 is shown in FIG. 1, example embodiments are not limited thereto. According to other example embodiments, a plurality of pulses corresponding to a program voltage may be repeatedly applied to the memory cells in the second time interval 121. The voltage magnitude of the repeatedly applied pulses may increase according to an order. These applied pulses may be referred to as an incremental step pulse program (ISPP).

A pulse 130 is applied to the gate terminal of the memory cell in a third time interval 131. A negative voltage corresponding to the pulse 130 may be too small to cause F-N tunneling. Thus, the charges stored in the charge trap layer may move in the channel direction in the charge trap layer without being discharged.

A pulse 140 is applied to the gate terminal of the memory cell in a fourth time interval 141. A positive voltage corresponding to the pulse 140 may be too small to cause F-N tunneling. Thus, the charges stored in the charge trap layer may move in the gate terminal direction in the charge trap layer without being further charged in the charge trap layer.

A pulse 150 is applied to the gate terminal of the memory cell in a fifth time interval 151. A negative voltage corresponding to the pulse 150 is of a magnitude less than the negative voltage corresponding to the pulse 130. Thus, the charges in the charge trap layer may move in the channel direction in the charge trap layer without being discharged.

A pulse 160 is applied to the gate terminal of the memory cell in a sixth time interval 161. A positive voltage corresponding to the pulse 160 is of a magnitude less than the positive voltage corresponding to the pulse 140. Thus, the charges in the charge trap layer may move in the gate terminal direction in the charge trap layer without being further charged in the charge trap layer.

When interpolating a voltage applied to a memory cell over time, it is possible to obtain a time domain characteristic of the voltage applied to the memory cell. A memory data programming method according to example embodiments may control the time domain characteristic to thereby adjust a frequency domain characteristic corresponding to the time domain characteristic.

For example, the pulse 110 corresponding to the erase process may not form the time domain characteristic and the pulse 120 through the pulse 140 may form the time domain characteristic.

Referring to FIG. 1, the negative pulse 110 corresponds to the erase operation and the positive pulse 120 corresponds to the program operation. However, example embodiments are not limited thereto. Specifically, the program operation may be performed by the negative pulse and the erase operation may be performed by the positive pulse.

Figure 2:
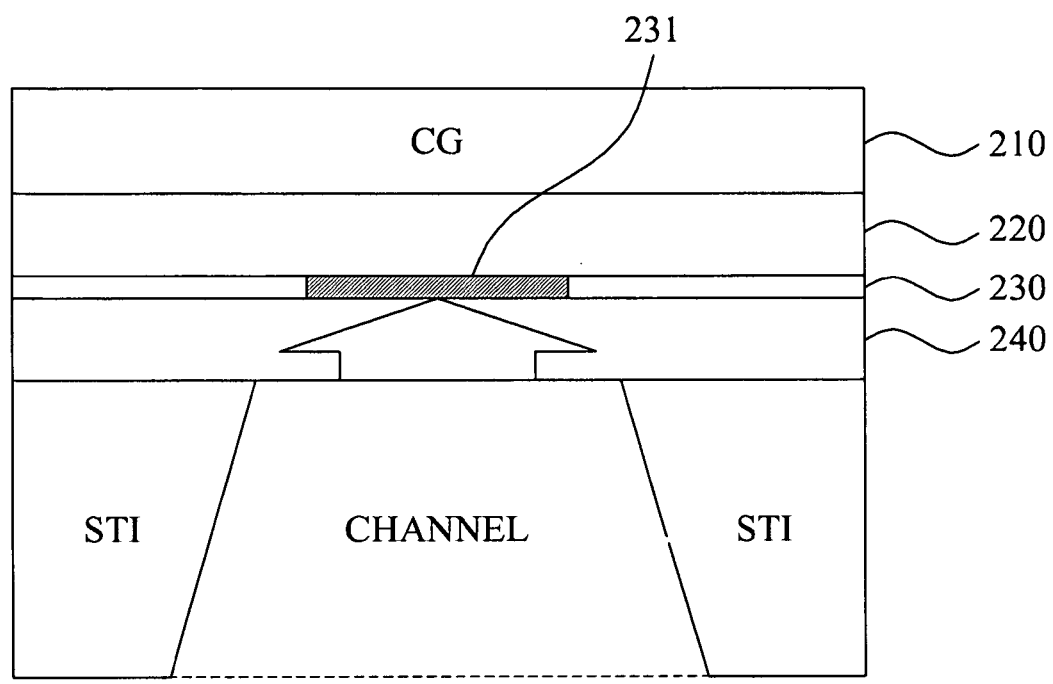
FIG. 2 is a diagram illustrating a structure of a memory cell of a charge trap memory according to an example embodiment.

FIG. 2 is a diagram illustrating the structure of a memory cell of a charge trap memory according to an example embodiment.

Referring to FIG. 2, the memory cell includes a second insulating layer 230 between a control gate (CG) layer 210 and a channel. A first insulating layer 220 between the second insulating layer 230 and the control gate (CG) layer 210 may function to insulate the CG layer 210 from the second insulating layer 230. A third insulating layer 240 between the second insulating layer 230 and the channel may function to insulate the second insulating layer 230 from the channel.

A shallow trench isolation (STI) layer included in the memory cell isolates adjacent memory cells. A portion of the second insulating layer 230 near the channel may function as a charge trap layer 231. The second insulating layer 230 may have a permittivity greater than the first insulating layer 220 and the third insulating layer 240.

A portion of the CG layer 210 near to the channel may function as the gate terminal of the memory cell. The CG layer 210 may be formed of metal or poly-silicon. FIG. 2 shows an unfolded structure of the CG layer 210 but example embodiments are not limited thereto. According to other example embodiments, a gate terminal may be separately provided for each memory cell.

When an electron exists as a majority carrier in the channel and the pulse 120 is applied to the CG layer 210, the electron in the channel may move to the charge trap layer 231 according to the F-N tunneling mechanism. When a plurality of electrons accumulate in the charge trap layer 231, a threshold voltage of the memory cell may increase. The memory data programming method according to example embodiments may control an amount of electrons accumulated in the charge trap layer 231 to thereby control the threshold voltage of the memory cell. The memory data programming method according to example embodiments may control the threshold voltage of the memory cell based on data to be programmed in the memory cell.

Figure 3:
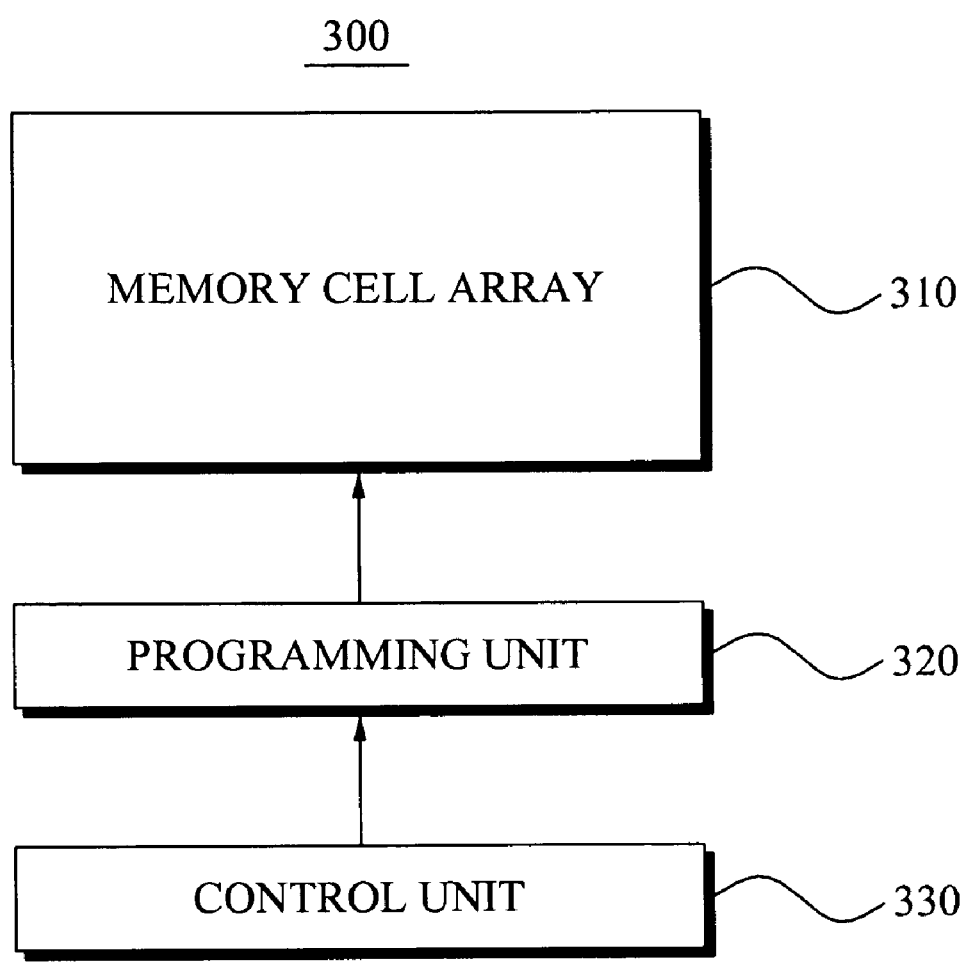
FIG. 3 is a block diagram illustrating a memory device according to an example embodiment.

FIG. 3 is a block diagram illustrating a memory device 300 according to an example embodiment.

Referring to FIG. 3, the memory device 300 includes a memory cell array 310, a programming unit 320, and a control unit 330.

The memory cell array 310 may include a plurality of memory cells. Each of the memory cells may have a charge trap site.

The programming unit 320 may repeatedly apply a plurality of positive pulses and a plurality of negative pulses to at least one of the plurality of memory cells. The programming unit 320 may apply at least one negative pulse to at least one of the plurality of memory cells included in a single erase block to thereby erase at least one of the plurality of memory cells included in the erase block.

The memory device 300, for example the control unit 330, may select, from the plurality of pages included in the erase block, a page corresponding to an address of a write command, a data store command, or a data program command with respect to the memory device 300. The programming unit 320 may apply at least one positive pulse to the selected page to program data.

The selected page may be a set of memory cells of memory cell array 310 connected to a single word line. The word line may be connected to a gate terminal of each of the memory cells included in the selected page.

The memory device 300, for example the control unit 330, may determine a voltage of a bit line of each of the memory cells included in the selected page, based on the data to be programmed. The programming unit 320 may apply the determined voltage to the bit line of each of the memory cells while a positive pulse is being applied to a gate terminal of each of the memory cells included in the selected page.

For example, the programming unit 320 may apply 0 volts of voltage to a bit line of a memory cell to be programmed with data "1," and apply 5 volts of voltage to a bit line of a memory cell to be programmed with data "0."

The programming unit 320 may repeatedly apply the positive pulses and the negative pulses to the gate terminal of each of the memory cells included in the selected page and thereby stabilize a threshold voltage of the memory cells included in the selected page. The memory device 300, for example the control unit 330, may interpolate the repeatedly applied positive pulses and negative pulses to thereby obtain a time domain characteristic.

The memory device 300, for example the control unit 330, may obtain a frequency band characteristic or a frequency domain characteristic corresponding to a time domain characteristic of positive pulses and negative pulses. When the frequency band characteristic has a wide range, it is possible to improve a mobility of charges charged in the memory cell.

The memory device 300, for example the control unit 330, may set a target frequency band characteristic. The memory device 300, for example the control unit 330, may set an optimal target frequency band characteristic that can improve the charge mobility based on the structure of the memory cell and characteristic of a material forming a charge trap layer.

The control unit 330 may control the magnitude of each of the positive pulses and the magnitude of each of negative pulses based on the target frequency band characteristic. The control unit 330 may control a temporal interval between the plurality of positive pulses and the plurality of negative pulses based on the target frequency band characteristic. The control unit 330 may convert the target frequency band characteristic to the time domain characteristic, and may also control the plurality of positive pulses and the plurality of negative pulses based on the converted time domain characteristic.

The memory device 300, for example the control unit 330, may set a target settling time based on a mobility of carriers charged in the memory cell. The target settling time denotes a time that a threshold voltage of a memory cell enters from an initialized value into an error range of a target voltage. In a charge trap memory, the threshold voltage of the memory cell in a program process may indicate an overshoot phenomenon. The target settling time may be affected by the mobility of the charged carriers.

The memory device 300, for example the control unit 330, may set a target frequency band characteristic that can achieve the target settling time. The relationship between the target settling time and the target frequency band characteristic may be obtained through experimentation, such as repetitive testing. Also, the relationship between the target settling time and the target frequency band characteristic may be obtained from a manufacturer of the memory device.

The memory device 300, for example the control unit 330, may control pulses to thereby reduce a time that is required to stabilize a threshold voltage of memory cells. The memory device 300, for example the control unit 330, may control pulses to thereby reduce the width of a distribution that is formed by the threshold voltage of memory cells.

The memory device 300, for example the control unit 330, may reduce the distribution width to decrease an error when reading data stored in the memory cells.

The memory cell array 310 may further include at least one monitoring cell. The monitoring cell does not store actual data but does store test data. The memory device 300, for example the control unit 330, may monitor a threshold voltage of the monitoring cell. The change in a threshold voltage of the monitoring cell over time may be caused by charge loss, a program disturbance, coupling, and the like.

The charge loss may be caused by a charge leakage via a leaking path of a damaged portion of the monitoring cell when a boundary between a charge trap layer and an insulating layer is damaged. The charge loss may also be caused by natural spreading of carriers charged in the charge trap layer.

Coupling may denote a phenomenon where a threshold voltage of a central memory cell is affected by a change in the threshold voltage of surrounding memory cells. Due to coupling of a parasitic capacitance between charge trap sites of memory cells, the threshold voltage of the central memory cell may be affected.

Program disturbance may denote a phenomenon where memory cells connected to the same word line affect each other for the program process, or where memory cells connected to the same bit line affect each other.

The control unit 330 may monitor a threshold voltage of the at least one monitoring cell and set a target frequency band characteristic based on the monitored threshold voltage.

The control unit 330 may control a temporal interval between the plurality of positive pulses and the plurality of negative pulses to correspond, for example, to a sinc function and may also control the magnitude of each of the positive pulses and the magnitude of each of the negative pulses. The sinc function may denote a function in the form of $$\frac{\sin(x)}{x} \text{ or } \frac{\sin(\pi x)}{\pi x}.$$

When the time domain characteristic is in the form of the sinc function, the frequency domain characteristic corresponding to the time domain characteristic may be in a bandpass form.

Figure 4:
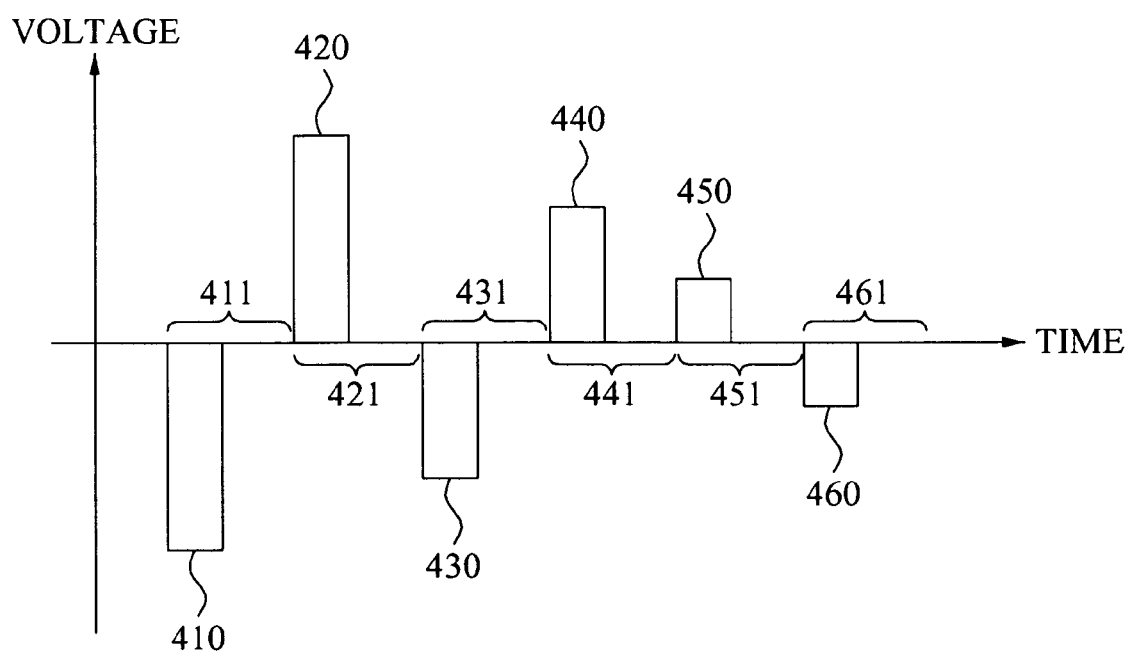
FIG. 4 is a timing diagram illustrating a voltage applied with respect to time by a method of programming memory data according to an example embodiment.

FIG. 4 is a timing diagram illustrating a voltage applied with respect to time by a method of programming memory data according to an example embodiment.

Referring to FIGS. 3 and 4, the memory device 300 applies a negative pulse 410 corresponding to an erase voltage to memory cells included in a selected erase block in a first time interval 411. A threshold voltage of the memory cells included in the erase block may be initialized.

In a second time interval 421, the memory device 300 applies a positive pulse 420 corresponding to a program voltage to the memory cells of the selected page. Although FIG. 4 illustrates example embodiments where a program process is performed by the pulse 420 in the second time interval 421, the memory device 300 according to other example embodiments may apply a plurality of pulses corresponding to the program voltage to memory cells of a selected page.

According to example embodiments, the memory device 300 may perform ISPP in the second time interval 421. The memory device 300 may apply the plurality of pulses with the incrementally increased voltage magnitude. The memory device 300 may apply each pulse and then determine whether a threshold voltage of memory cells has reached a target voltage, and may apply a program inhibit voltage to a bit line of each of memory cells with a threshold voltage greater than or equal to the target voltage. The memory device 300 may set a target voltage of each of the memory cells based on data to be programmed in each of the memory cells. For example, the memory device 300 may set, to 1 volt, a target voltage of a memory cell to be programmed with data "11". The memory device 300 may set, to 2 volts, a target voltage of a memory cell to be programmed with data "10". The memory device 300 may set, to 3 volts, a target voltage of a memory cell to be programmed with data "01". The memory device 300 may set, to 4 volts, a target voltage of a memory cell to be programmed with data "00".

In a third time interval 431, the memory device 300 applies a negative pulse 430 of a magnitude less than the erase voltage to the memory cells included in the selected page.

In a fourth time interval 441, the memory device 300 applies a positive pulse 440 of a magnitude less than the program voltage to the memory cells included in the selected page.

In a fifth time interval 451, the memory device 300 applies a positive pulse 450 of a magnitude less than the magnitude of the pulse 440 to the memory cells included in the selected page.

In a sixth time interval 461, the memory device 300 applies a negative pulse 460 of a magnitude less than the magnitude of the pulse 430 to the memory cells included in the selected page.

The memory device 300 may apply a positive pulse and a negative pulse in turn to the memory cells. Also, the memory device 300 may continuously apply the plurality of positive pulses between the negative pulses and may also continuously apply the plurality of negative pulses between the positive pulses.

Referring to FIGS. 1, 3 and 4, the programming unit 320 is configured to apply a plurality of pulses 110, 120, 130, 140, 150, 160 or 410, 420, 430, 440, 450, 460 to the plurality of memory cells, at least one of the plurality of pulses being a positive pulse having a positive voltage and at least one of the plurality of pulses being a negative pulse having a negative voltage. A temporal interval 111, 121, 131, 141, 151, 161 or 411, 421, 431, 441, 451, 461 exists between subsequent pulses of the plurality of pulses. The control unit 330 is configured to control at least one of a width of at least one of the temporal intervals and a magnitude of at least one of the plurality of pulses.

The programming unit 320 may apply a positive set of pulses alternating with a negative set of pulses, where the positive set includes the at least one positive pulse 120, 140 160 or 420, 440, 460 and the negative set includes the at least one negative pulse 110, 130, 150 or 410, 430, 450. The control unit 330 may control a number of the positive pulses between consecutive negative pulses and a number of the negative pulses between consecutive positive pulses.

The programming unit 320 may apply at least one positive set of pulses alternating with at least one negative set of pulses, where each of the positive sets includes the at least one positive pulse and each of the negative sets includes the at least one negative pulse. Further, the control unit 320 may control a number of the positive pulses in at least one of the positive sets and a number of the negative pulses in at least one of the negative sets.

The control unit 330 may control the magnitude of each subsequent positive pulse to be less than the magnitude of each previous positive pulse and control the magnitude of each subsequent negative pulse to be less than a magnitude of each previous negative pulse.

Figure 5:
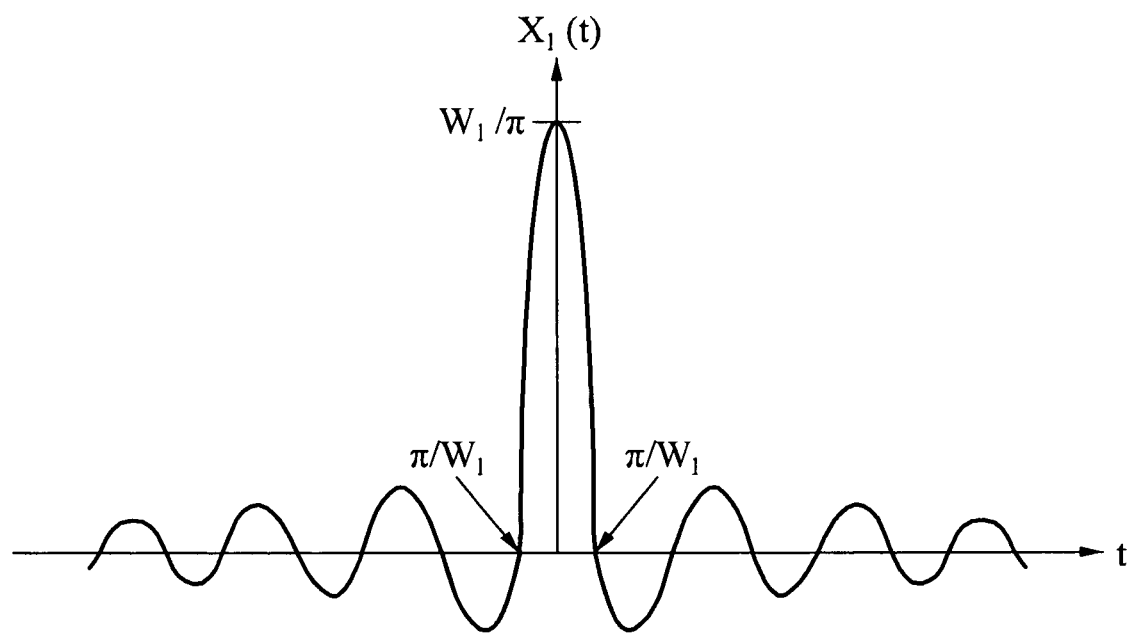
FIG. 5 is a diagram illustrating an example of a time domain characteristic and a frequency domain characteristic according to an example embodiment.
Figure 5:
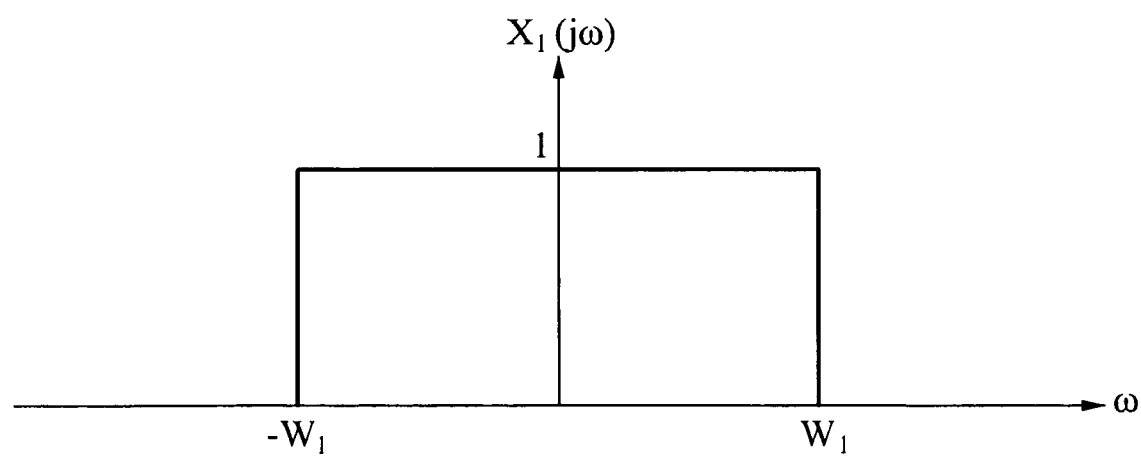

FIG. 5 is a diagram illustrating an example of a time domain characteristic and a frequency domain characteristic according to an example embodiment.

FIG. 5 shows time domain characteristic $X_1(t)$ corresponding to frequency domain characteristic $X_1(jw)$.

The frequency domain characteristic $X_1(jw)$ has a magnitude of 1 and a cutoff frequency of $W_1$. The time domain characteristic $X_1(t)$ corresponding to the frequency domain characteristic $X_1(jw)$ may be represented as $$X_1(t) = \frac{\sin(W_1 x)}{\pi x}.$$

When the relationship that $X_1(n\ \pi/W_1)=0$, where n is an integer is satisfied and t approaches zero, the time domain characteristic $X_1(t)$ may be converged to a value of $W_1/\pi$.

Figure 6:
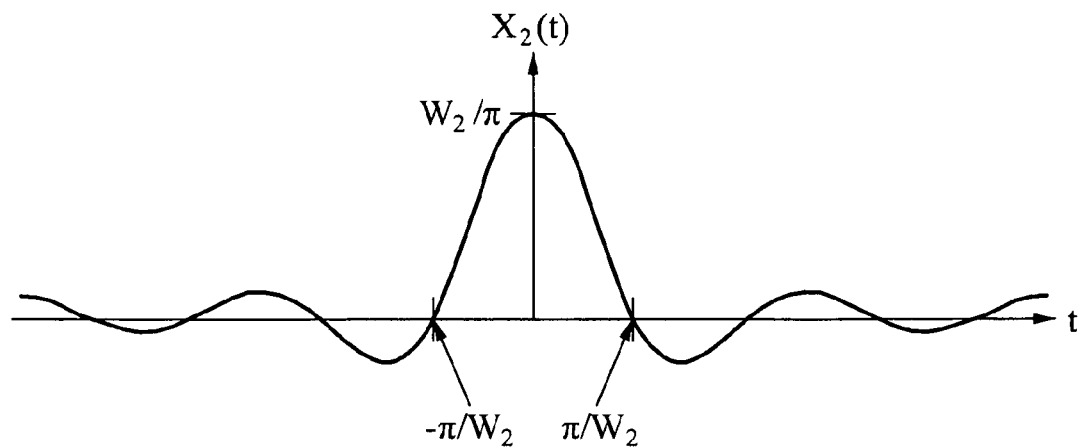
FIG. 6 is a diagram illustrating another example of a time domain characteristic and a frequency domain characteristic according to an example embodiment.
Figure 6:
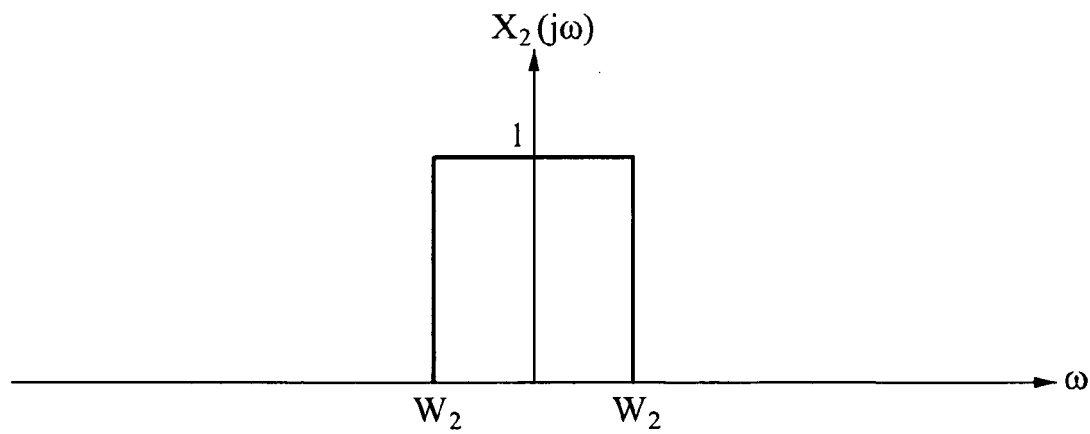

FIG. 6 is a diagram illustrating another example of a time domain characteristic and a frequency domain characteristic according to an example embodiment.

FIG. 6 shows time domain frequency $X_2(t)$ corresponding to frequency domain characteristic $X_2(jw)$.

The frequency domain characteristic $X_2(jw)$ has the magnitude of 1 and has a cutoff frequency of $W_2$. The time domain characteristic $X_2(t)$ corresponding to the frequency domain characteristic $X_2(jw)$ may be represented as $$X_2(t) = \frac{\sin(W_2 x)}{\pi x}.$$

When the relationship that $X_2(n\ \pi/W_2)=0$, where n is an integer is satisfied and t approaches zero, the time domain characteristic $X_2(t)$ may be converged to a value of $W_2/\pi$.

When comparing FIGS. 5 and 6, it can be seen that $W_1$ is greater than $W_2$ and that the frequency domain characteristic $X_1(t)$ has a relatively narrow width with respect to a time axis in comparison to the time domain characteristic $X_2(t)$. The memory device 300 may set a target frequency domain characteristic and set a time domain characteristic corresponding to the set target frequency domain characteristic. The memory device 300 may control the magnitude of repeatedly applied pulses and a time interval between the pulses based on the time domain characteristic.

FIG. 7 is a flowchart illustrating a method of programming memory data according to an example embodiment.

In operation S710, the memory data programming method may apply an erase voltage to a plurality of memory cells. The memory data programming method may apply the erase voltage to a plurality of memory cells included in an erase block to thereby discharge charges charged in the plurality of memory cells. The memory data programming method may discharge the charged charges to thereby initialize a threshold voltage of the memory cells.

The memory data programming method may select a page corresponding to an address of a write command from a plurality of pages included in the erase block. In operation S720, the memory data programming method may apply a program voltage to a plurality of memory cells included in the selected page. The memory data programming method may apply the program voltage to a gate terminal of each of the memory cells included in the selected page and adjust a bit line voltage of each of the memory cells included in the selected page based on data to be programmed. The memory data programming method may apply the program voltage to thereby charge charges in the plurality of memory cells. The charged charges correspond to data to be programmed. The memory data programming method may charge the charges in the plurality of memory cells to thereby store data in the plurality of memory cells.

The memory data programming method may adjust the magnitude and direction of an electric field applied to a plurality of memory cells to thereby move carriers stored in a charge trap layer. The memory data programming method may move the carriers stored in the charge trap layer to thereby stabilize data stored in the plurality of memory cells.

In operation S730, the memory data programming method may determine the width of the pulses to be applied to the plurality of memory cells included in the selected page and a temporal interval between the pulses.

In operation S740, the memory data programming method may apply a negative pulse to the plurality of memory cells so that the carriers stored in the plurality of memory cells may be moved. In operation S750, the memory data programming method may also apply a positive pulse to the plurality of memory cells so that the carriers stored in the plurality of memory cells may be moved.

In operation S760, the memory data programming method may determine whether a number of times that a pulse is applied is less than a threshold N, where N is a natural number. When the applied number of times is less than the threshold N, the memory data programming method may repeatedly perform operations S740 and S750.

The memory data programming method may adjust the width of pulses and the temporal interval between the pulses applied to the plurality of memory cells. The memory data programming method may also adjust the magnitude of the pulses to thereby control a time domain characteristic and a frequency domain characteristic that are generated by the pulses.

The memory data programming method may control pulses so that the wide range of frequency domain characteristics may appear. The memory data programming method may control the pulses to emphasize a frequency domain characteristic of a particular band.

The memory data programming method according to example embodiments may be recorded in computer-readable media including program instructions to implement various operations embodied by a computer. The media may also include, alone or in combination with the program instructions, data files, data structures, and/or the like. The media and program instructions may be those especially designed and constructed for the purposes of example embodiments, or they may be of the kind well-known and available to those having skill in the computer software arts. Examples of computer-readable media include magnetic media such as hard disks, floppy disks, and magnetic tape; optical media such as CD-ROM disks and DVD; magneto-optical media such as optical disks; and hardware devices that are especially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages such as Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In example embodiments, the memory controllers may be constructed to communicate with an external device for example, a host using any one of various types of protocols such as a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that may maintain stored data even when power is cut off. According to an increase in the use of mobile devices such as a cellular phone, a personal digital assistant (PDA), a digital camera, a portable game console, and an MP3 player, the flash memory devices may be more widely used as data storage and code storage. The flash memory devices may be used in home applications such as a high definition television (HDTV), a digital video disk (DVD), a router, and a Global Positioning System (GPS).

A computing system, according to example embodiments, may include a microprocessor that may be electrically connected with a bus, a user interface, a modem such as a baseband chipset, a memory controller, and a flash memory device. The flash memory device may store N-bit data via the memory controller. The N-bit data may be processed or will be processed by the microprocessor and N may be 1 or an integer greater than 1. When the computing system is a mobile apparatus, a battery may be additionally provided to supply operation voltage to the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

While example embodiments have been particularly shown and described, it will be understood by those of ordinary skill in the art that various changes in form and details may be made therein without departing from the spirit and scope of the present invention as defined by the following claims.

What is claimed is:

1. A method of programming data in a memory device, comprising:
applying a plurality of pulses to a plurality of memory cells, at least one of the plurality of pulses being a positive pulse having a positive voltage and at least one of the plurality of pulses being a negative pulse having a negative voltage, and temporal intervals existing between subsequent pulses of the plurality of pulses; and
controlling at least one of a width of at least one of the temporal intervals and a magnitude of at least one of the plurality of pulses based on at least one of a frequency band characteristic and a sinc function.

2. The method of claim 1, wherein the applying applies a positive set of pulses alternating with a negative set of pulses, where the positive set includes the at least one positive pulse and the negative set includes the at least one negative pulse.

3. The method of claim 1, wherein the controlling controls a number of the positive pulses between consecutive negative pulses and a number of the negative pulses between consecutive positive pulses.

4. The method of claim 1, wherein,
the applying applies at least one positive set of pulses alternating with at least one negative set of pulses, where each of the positive sets includes the at least one positive pulse and each of the negative sets includes the at least one negative pulse, and
the controlling controls a number of the positive pulses in at least one of the positive sets and a number of the negative pulses in at least one of the negative sets.

5. The method of claim 1, wherein the controlling controls the magnitude of each subsequent positive pulse to be less than the magnitude of each previous positive pulse and controls the magnitude of each subsequent negative pulse to be less than a magnitude of each previous negative pulse.

6. The method of claim 1, wherein the controlling converts at least one of the frequency band characteristic and the sinc function to a time domain characteristic, and controls at least one of the width of at least one of the temporal intervals and the magnitude of at least one of the plurality of pulses based on the converted time domain characteristic.

7. The method of claim 1, wherein the controlling sets at least one of the frequency band characteristic and the sinc function based on a target settling time of a threshold voltage of at least one of the plurality of memory cells.

8. The method of claim 1, wherein the controlling controls a threshold voltage of at least one monitoring cell included in the plurality of memory cells and sets at least one of the frequency band characteristic and the sinc function based on the monitored threshold voltage.

9. The method of claim 1, wherein,
the applying applies a program voltage to at least one of the memory cells to change a threshold voltage of at least one of the plurality of memory cells, and
the applying applies an erase voltage to at least one of the plurality memory cells to initialize a threshold voltage of at least one of the plurality of memory cells.

10. The method of claim 9, wherein the applying applies at least one of the positive pulses and at least one of the negative pulses to stabilize charges charged in at least one of the plurality of memory cells.

11. The method of claim 9, wherein the controlling controls the magnitude of each of the positive pulses to be less than a magnitude of the program voltage and controls the magnitude of each of the negative pulses to be less than a magnitude of the erase voltage.

12. A computer-readable recording medium storing a computer program for implementing the method of claim 1.

13. A method of programming memory data, the method comprising:
applying a program voltage to at least one of a plurality of memory cells to charge charges in at least one of the plurality of memory cells;

applying at least one negative pulse to at least one of the plurality of memory cells to move the charged charges;

applying at least one positive pulse to the plurality of memory cells to move the charged charges; and controlling at least one of a width of at least one temporal interval and a magnitude of at least one of a plurality of pulses based on at least one of a frequency band characteristic and a sinc function, where the temporal interval exists between application of subsequent pulses of the plurality of pulses, the plurality of pulses including the at least one positive pulse and the at least one negative pulse.

14. The method of claim 13, further comprising:

applying an erase voltage to the plurality of memory cells to discharge the charges of at least one of the plurality of memory cells before the applying the program voltage to the at least one plurality of memory cells, wherein the applying the at least one negative pulse applies the at least one negative pulse to have a magnitude less than a magnitude of the erase voltage, and wherein the applying the at least one positive pulse applies the at least one positive pulse to have a magnitude less than a magnitude of the program voltage.

15. The method of claim 13, wherein the controlling controls the applying the at least one negative pulse and the applying the at least one positive pulse to apply a positive set of pulses alternating with a negative set of pulses, where the positive set includes the at least one positive pulse and the negative set includes the at least one negative pulse.

16. The method of claim 13, wherein the controlling controls a number of the positive pulses between consecutive negative pulses and a number of the negative pulses between consecutive positive pulses.

17. The method of claim 13, wherein the controlling controls the magnitude of each subsequent positive pulse to be less than the magnitude of each previous positive pulse and controls the magnitude of each subsequent negative pulse to be less than a magnitude of each previous negative pulse.

18. A computer-readable recording medium storing a computer program for implementing the method of claim 13.

* * * * *